US012787828B2

(12) United States Patent
Kuranaga et al.

(10) Patent No.: US 12,787,828 B2

(45) Date of Patent: Nov. 3, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Seiya Kuranaga, Tokyo (JP); Yukihiro Morishita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/819,874

(22) Filed: Aug. 15, 2022

(65) Prior Publication Data

US 2023/0154811 A1 May 18, 2023

(30) Foreign Application Priority Data

Nov. 18, 2021 (JP) ................................ 2021-187610

(51) Int. Cl.

*H10W 70/68* (2026.01)
*H10W 40/25* (2026.01)
*H10W 99/00* (2026.01)

(52) U.S. Cl.

CPC ......... *H10W 70/68* (2026.01); *H10W 40/255* (2026.01); *H10W 99/00* (2026.01)

(58) Field of Classification Search

CPC ................ H01L 21/4807; H01L 24/32; H01L 23/488; H01L 2021/60007

See application file for complete search history.

(56) References Cited

U.S. PATENT DOCUMENTS

| | | | | |
|---|---|---|---|---|
| 11,908,772 | B2 * | 2/2024 | Yamada | H01L 23/473 |
| 2007/0045870 | A1 * | 3/2007 | Kuramochi | H10W 74/012 257/E23.021 |
| 2007/0057373 | A1 * | 3/2007 | Okumura | H01L 24/32 257/746 |
| 2008/0124834 | A1 * | 5/2008 | Fujimori | H01L 24/03 438/106 |
| 2014/0077375 | A1 | 3/2014 | Hara et al. | |
| 2014/0138839 | A1 | 5/2014 | Ha et al. | |
| 2016/0071821 | A1 | 3/2016 | Masumoto et al. | |
| 2019/0341345 | A1 | 11/2019 | Nishida | |

(Continued)

FOREIGN PATENT DOCUMENTS

| | | | |
|---|---|---|---|
| CN | 110709969 | A | 1/2020 |
| DE | 102015215132 | A1 | 3/2016 |

(Continued)

OTHER PUBLICATIONS

Machine Translation of JP-2009094135-A.*

(Continued)

*Primary Examiner* — Yara B Green

*Assistant Examiner* — Fakeha Sehar

(74) *Attorney, Agent, or Firm* — Studebaker Brackett PLLC

(57) ABSTRACT

A semiconductor device includes an insulating substrate and a semiconductor element. The insulating substrate includes an insulating layer and a front surface circuit pattern disposed on a surface of the insulating layer. The semiconductor element is bonded to a mount of a surface of the front surface circuit pattern via solder. A groove is provided in a region including a portion of the mount.

8 Claims, 8 Drawing Sheets

(56) References Cited

U.S. PATENT DOCUMENTS

| | | | | |
|---|---|---|---|---|
| 2020/0135682 | A1 * | 4/2020 | Ishikawa | H01L 24/32 |
| 2023/0014158 | A1 | 1/2023 | Ishikawa | |

FOREIGN PATENT DOCUMENTS

| | | | | | |
|---|---|---|---|---|---|
| JP | S56-084356 | U | | 7/1981 | |
| JP | 2004119568 | A | * | 4/2004 | |
| JP | 2004349399 | A | * | 12/2004 | |
| JP | 2007-060221 | A | | 3/2007 | |
| JP | 2009094135 | A | * | 4/2009 | H01L 24/32 |
| JP | 2011-066078 | A | | 3/2011 | |
| JP | 2014060211 | A | * | 4/2014 | H01L 23/13 |
| JP | 2014-154571 | A | | 8/2014 | |
| JP | 2014-216459 | A | | 11/2014 | |
| WO | 2018/220819 | A1 | | 12/2018 | |

OTHER PUBLICATIONS

Machine Translation of JP-2004119568-A.*
Machine Translation of JP2014060211A.*
JP2004349399A Machine Translation (Year: 2004).*
An Office Action; "Notice of Reasons for Refusal," mailed by the Japanese Patent Office on Jul. 23, 2024, which corresponds to Japanese Patent Application No. 2021-187610 and is related to U.S. Appl. No. 17/819,874; with English language translation.
Office Action issued in DE 10 2022 124 037.1; mailed by the German Patent and Trademark Office on Oct. 31, 2024.
Office Action issued in Cn 202211412738.X; mailed by the State Intellectual Property Office of the People's Republic of China on Jun. 30, 2026.

* cited by examiner

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

In a semiconductor device including a semiconductor element, it is common to use solder to bond an insulating substrate including an insulating layer formed of resin, ceramics, and the like and a circuit pattern formed on a top surface of the insulating layer to a base plate formed of metal and the like, and to bond the semiconductor element to the circuit pattern.

After the semiconductor element is disposed on the solder before curing disposed on the circuit pattern, and the solder before curing is heated to be melted, the melted solder is cooled to be cured to thereby bond the semiconductor element to the circuit pattern. In a case where a portion of the melted solder squirts out from below the semiconductor element when curing, there has been a problem in that the solder adheres to surfaces of electric wiring and the semiconductor element as components in the semiconductor device.

To suppress adherence of the solder to the surfaces of the electric wiring and the semiconductor element, Japanese Patent Application Laid-Open No. 2004-119568 and Japanese Patent Application Laid-Open No. 2007-60221 each disclose a configuration in which a groove to store solder squirting out from below a semiconductor element is provided, for example.

In the configuration disclosed in each of Japanese Patent Application Laid-Open No. 2004-119568 and Japanese Patent Application Laid-Open No. 2007-60221, however, the groove is provided to surround the entire perimeter of the semiconductor element, leading to high processing costs of the circuit pattern.

Furthermore, in a case where the groove is provided around the entire perimeter of the semiconductor element, a final solidification point when the melted solder solidifies is unknown. In a case where large stress is caused at an outer edge of the semiconductor element due to contraction of the solder, the solder can squirt out beyond the groove, adding to inspection costs due to the need to conduct visual inspection for quality assurance around the entire perimeter of the groove. This results in an increase in manufacturing costs of the semiconductor device.

SUMMARY

It is an object of the present disclosure to provide technology enabling suppression of adherence of solder squirting out from below a semiconductor element to another member in a semiconductor device and suppression of an increase in manufacturing costs of the semiconductor device.

A semiconductor device according to the present disclosure includes an insulating substrate and a semiconductor element. The insulating substrate includes an insulating layer and a circuit pattern disposed on a surface of the insulating layer. The semiconductor element is bonded to a mount of a surface of the circuit pattern via solder. A groove is provided in a region including a portion of the mount.

The solder squirting out from below the semiconductor element flows into the groove to suppress adherence of the solder to another member in the semiconductor device. Furthermore, compared with a case where the groove is provided around the entire perimeter of the mount, processing costs of the circuit pattern can be suppressed, and, as visual inspection is conducted only at the groove, a time of visual inspection can be reduced, and costs for visual inspection can be suppressed. This can suppress an increase in manufacturing costs of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Configuration of Semiconductor Device

Figure 1:
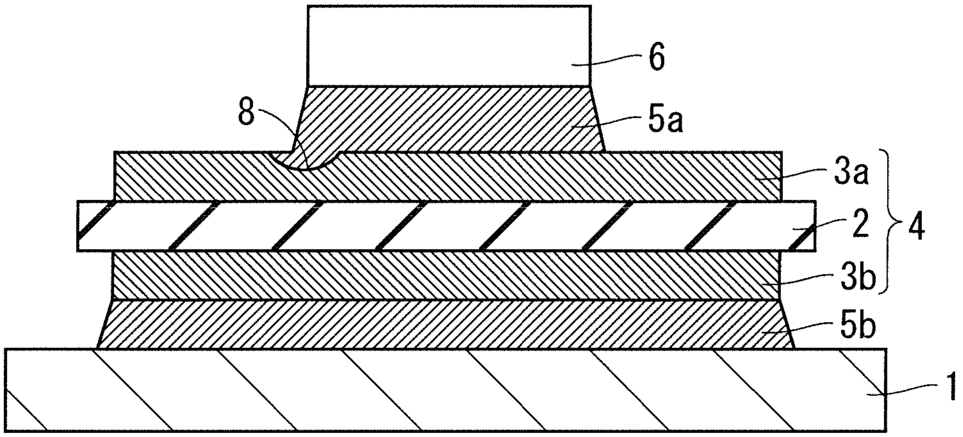
FIG. 1 is a partial cross-sectional view of a semiconductor device according to Embodiment 1.
Figure 2:
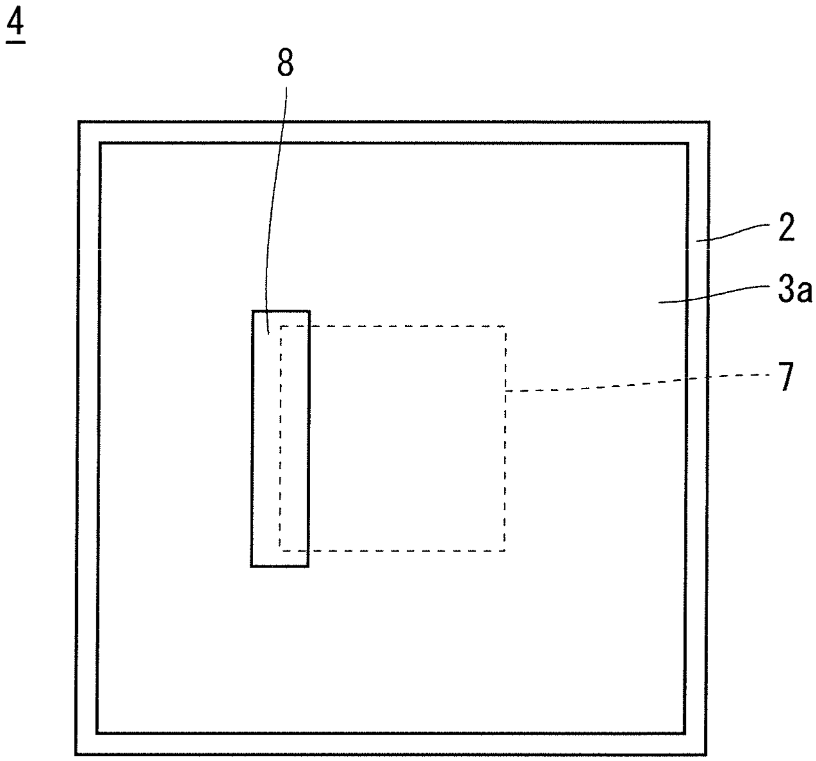
FIG. 2 is a top view of an insulating substrate of the semiconductor device according to Embodiment 1.

Embodiment 1 will be described below with reference to the drawings. FIG. 1 is a partial cross-sectional view of a semiconductor device according to Embodiment 1. FIG. 2 is a top view of an insulating substrate 4 of the semiconductor device according to Embodiment 1.

As illustrated in FIG. 1, the semiconductor device includes a base plate 1, the insulating substrate 4, and a semiconductor element 6. While a material for the base plate 1 is not particularly limited, the base plate 1 often includes copper or a copper alloy as a main material. The base plate 1 may include a metal material, such as aluminum and an aluminum alloy, or a composite material, such as AlSiC and MgSiC, as a main material, and may have a surface plated with nickel, copper, and the like.

As illustrated in FIGS. 1 and 2, the insulating substrate 4 is bonded to a top surface of the base plate 1 via solder **5*b*. The insulating substrate 4 includes an insulating layer 2 having a front surface and a back surface, a front surface circuit pattern 3*a*, and a back surface circuit pattern 3*b*. The insulating layer 2, the front surface circuit pattern 3*a*, and the back surface circuit pattern 3*b*** are each rectangular in top view.

While a material for the insulating layer 2 is not particularly limited, the insulating layer 2 may include an inorganic ceramic material, such as alumina ($Al_2O_3$), aluminum nitride (AlN), and silicon nitride ($Si_3N_4$), as a main material, or may include a resin material, such as silicone resin, acrylic resin, and polyphenylenesulfide (PPS) resin, as a main material.

The front surface circuit pattern 3*a* is disposed on the front surface of the insulating layer 2. The back surface circuit pattern 3*b* is disposed on the back surface of the insulating layer 2.

While a material for the front surface circuit pattern 3*a* and the back surface circuit pattern 3*b* is not particularly limited, the front surface circuit pattern 3*a* and the back surface circuit pattern 3*b* often include copper or a copper alloy as a main material. The front surface circuit pattern 3*a* and the back surface circuit pattern 3*b* may each include a metal material, such as aluminum and an aluminum alloy, as a main material, and may each have a surface plated with nickel, copper, and the like.

The front surface circuit pattern 3*a* and the back surface circuit pattern 3*b* may include the same material as a main material, or may include different materials as a main material. The back surface circuit pattern 3*b* may double as the base plate 1. In this case, the insulating layer 2 is disposed on the back surface circuit pattern 3*b* doubling as the base plate 1, and the front surface circuit pattern 3*a* is disposed on the insulating layer 2. The front surface circuit pattern 3*a* herein corresponds to a circuit pattern disposed on a surface of the insulating layer 2.

The semiconductor element 6 is bonded to a mount 7 of a surface of the front surface circuit pattern 3*a* via solder 5*a*. The mount 7 is a bonding region of the surface of the front surface circuit pattern 3*a* where the semiconductor element 6 is bonded. The semiconductor element 6 includes silicon (Si), silicon carbide (SiC), gallium nitride (GaN), and the like as a main material. The semiconductor element 6 is a power semiconductor element, such as an insulated gate bipolar transistor (IGBT), a metal oxide semiconductor field effect transistor (MOSFET), a free wheeling diode (FwDi), and a reverse conducting IGBT (RC-IGBT).

While a material for the solder 5*a* and the solder 5*b* is not particularly limited, the solder 5*a* and the solder 5*b* may each include a solder alloy, such as an Sn—Ag—Cu alloy and an Sn—Sb alloy, as a main material. The solder 5*a* and the solder 5*b* each may contain flux, or may not contain flux. While forms of the solder 5*a* and the solder 5*b* before bonding are not particularly limited, the solder 5*a* and the solder 5*b* may be plate-like (solid), or may be pasty. The solder 5*a* and the solder 5*b* each preferably have a thickness of approximately 100 μm or more and 150 μm or less at a location other than a groove 8, which will be described below.

Although not illustrated, a case including thermoplastic resin, such as PPS resin, as a main material is disposed on a perimeter of the base plate 1 to surround side surfaces of the semiconductor element 6 and the insulating substrate 4, and the interior of the case is sealed with a silicone gel material or epoxy resin. The number of semiconductor elements 6 is not limited to one, and a plurality of semiconductor elements 6 may be mounted. In this case, the plurality of semiconductor elements 6 are internally wired by metal wires to be electrically connected.

The surface of the front surface circuit pattern 3*a* has the mount 7 where the semiconductor element 6 is mounted. The semiconductor element 6 and the mount 7 are each rectangular in top view, and the mount 7 has a larger outline than the semiconductor element 6 in top view, which are not illustrated.

The groove 8 is provided in a region including a portion of the mount 7 of the surface of the front surface circuit pattern 3*a*. The groove 8 is provided linearly in a region including one side of an outer perimeter edge of the mount 7. The groove 8 has a function of storing the solder 5*a* squirting out when the melted solder 5*a* solidifies and a function of guiding a location where the solder 5*a* squirts out to a region around the groove 8. Turning briefly to the latter function, thermal capacity of the groove 8 increases due to the solder 5*a* filling the groove 8 to cause a final solidification point of the solder 5*a* to be the groove 8. The location where the solder 5*a* squirts out can thereby be guided to the region around the groove 8.

The location where the solder 5*a* squirts out has been unidentifiable, and there has been a need to conduct visual inspection around the entire perimeter of the mount 7, but, as the location where the solder 5*a* squirts out can be guided to the region around the groove 8, visual inspection is only required to be conducted at the groove 8. This can reduce a time of visual inspection, and suppress costs for visual inspection.

The groove 8 preferably has a curved cross section, but may have a V-shaped cross section or a recessed cross section. The groove 8 has a depth smaller than the thickness of the front surface circuit pattern 3*a*, and preferably has a small depth of approximately 20 μm or more and 30 μm or less to avoid a local increase in thickness of the solder 5*a*. The groove 8 preferably has a width of 500 μm or more and 1 mm or less.

While a method of forming the groove 8 is not particularly limited, the groove 8 may be formed by cutting or die pressing. The groove 8 may be formed by laser irradiation.

A location where the groove 8 is formed is not particularly limited as long as it is a region including one side of the outer perimeter edge of the mount 7, but, in a case where the location where the solder 5*a* squirts out is predictable according to conditions such as a combination of the insulating substrate 4 and the semiconductor element 6, sizes of the insulating substrate 4 and the semiconductor element 6, and a temperature profile when the solder 5*a* is melted, the groove 8 is preferably formed in a region around the location.

Effects

A method of manufacturing the semiconductor device will be briefly described to describe effects of the semiconductor device according to Embodiment 1.

First, the insulating substrate 4 including the front surface circuit pattern 3*a* having the groove 8 in the surface thereof is prepared. The groove 8 is formed by cutting, die pressing, or laser irradiation as described above. Next, after the solder 5*a* before curing is disposed on the mount 7, the semiconductor element 6 is disposed on the solder 5*a* before curing.

Next, after the solder 5*a* before curing is heated to be melted, the melted solder 5*a* is cooled to be cured to thereby bond the semiconductor element 6 to the mount 7. In this case, a portion of the melted solder 5*a* attempts to squirt out, but flows into the groove 8 and is cured in this state as the groove 8 is provided in the region including the portion of the mount 7.

As described above, the semiconductor device according to Embodiment 1 includes: the insulating substrate 4 including the insulating layer 2 and the front surface circuit pattern 3*a* disposed on the surface of the insulating layer 2; and the semiconductor element 6 bonded to the mount 7 of the surface of the front surface circuit pattern 3*a* via the solder 5*a*, wherein the groove 8 is provided in the region including the portion of the mount 7.

Specifically, the groove 8 is provided linearly in the region including one side of the outer perimeter edge of the mount 7. The groove 8 is provided in the region including the portion of the mount 7, and the solder 5*a* squirting out from below the semiconductor element 6 flows into the groove 8 to suppress adherence of the solder 5*a* to another member in the semiconductor device. Compared with a case where the groove 8 is provided around the entire perimeter of the mount 7, processing costs of the front surface circuit pattern 3*a* can be suppressed. Furthermore, the location where the solder 5*a* squirts out can be guided to the region around the groove 8 as described above, so that visual inspection is conducted only at the groove 8 to reduce the time of visual inspection and suppress the costs for visual inspection. This can suppress an increase in manufacturing costs of the semiconductor device.

A method of manufacturing the semiconductor device according to Embodiment 1 includes: (a) preparing the insulating substrate 4 including the front surface circuit pattern 3*a* having the groove 8 in the surface thereof; (b) disposing the solder 5*a* before curing on the mount 7; (c) disposing the semiconductor element 6 on the solder 5*a* before curing; and (d) after heating the solder 5*a* before curing to melt the solder 5*a*, cooling the melted solder 5*a* to cure the solder 5*a* to thereby bond the semiconductor element 6 to the mount 7, wherein the groove 8 is provided in the region around the location where the portion of the melted solder 5*a* squirts out when curing in step (d).

The solder 5*a* squirting out from below the semiconductor element 6 is thus likely to flow into the groove 8 to further improve the effect of suppressing adherence of the solder 5*a* to another member in the semiconductor device.

Embodiment 2

Figure 3:
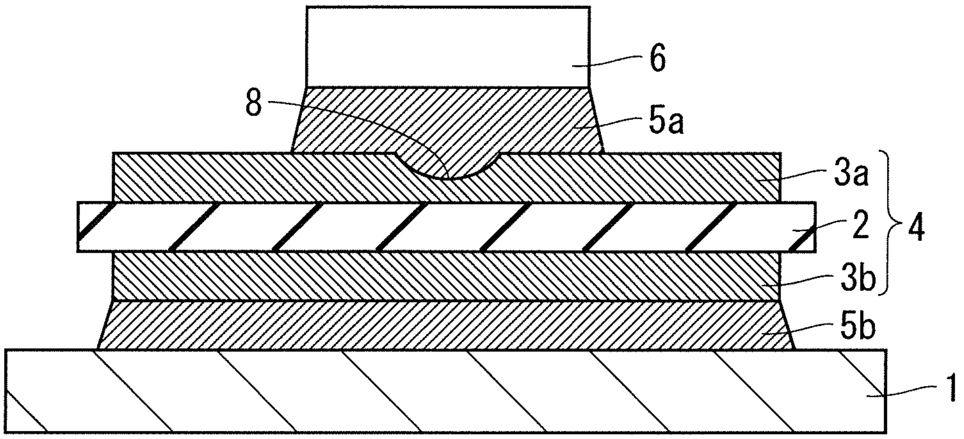
FIG. 3 is a partial cross-sectional view of a semiconductor device according to Embodiment 2.
Figure 4:
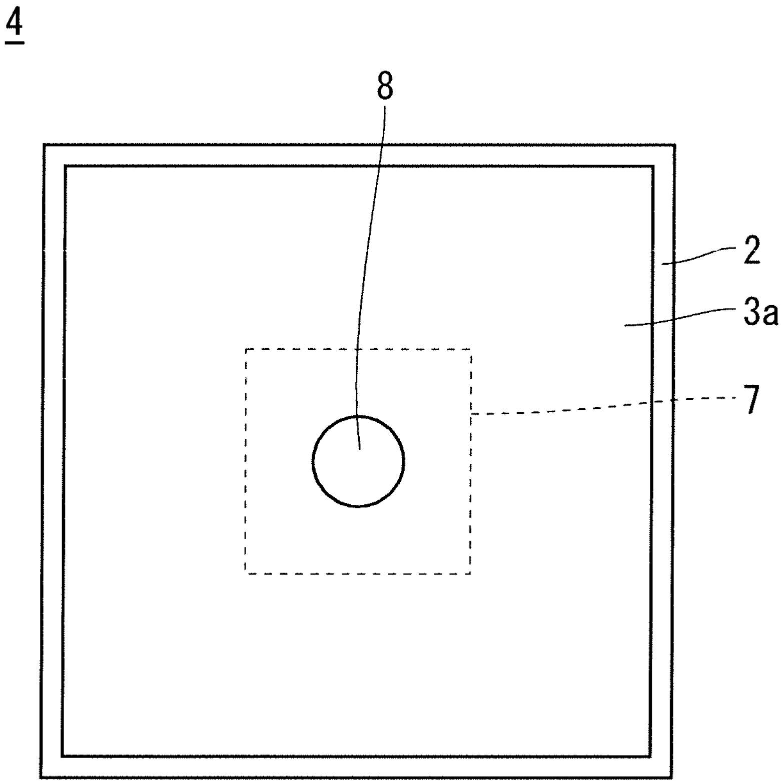
FIG. 4 is a top view of an insulating substrate of the semiconductor device according to Embodiment 2.

A semiconductor device according to Embodiment 2 will be described next. FIG. 3 is a partial cross-sectional view of the semiconductor device according to Embodiment 2. FIG. 4 is a top view of the insulating substrate 4 of the semiconductor device according to Embodiment 2. In Embodiment 2, the same components as those described in Embodiment 1 bear the same reference signs as those of the components described in Embodiment 1, and description thereof will be omitted.

As illustrated in FIGS. 3 and 4, the groove 8 is provided at the center of the mount 7 to be hemispherical in Embodiment 2.

The groove 8 has a depth smaller than the thickness of the front surface circuit pattern 3*a*, and preferably has a small depth of approximately 20 μm or more and 30 μm or less to avoid a local increase in thickness of the solder 5*a*. The groove 8 preferably has a diameter of 4 mm or more and 6 mm or less, but may have a diameter less than or more than the range in view of the size of the semiconductor element 6 and the amount of solder 5*a*.

While a method of forming the groove 8 is not particularly limited, the groove 8 may be formed by cutting or die pressing. The groove 8 may be formed by laser irradiation.

As described above, in the semiconductor device according to Embodiment 2, the groove 8 is provided at the center of the mount 7 to be hemispherical. The solder 5*a* squirting out from below the semiconductor element 6 flows into the groove 8 to suppress adherence of the solder 5*a* to another member in the semiconductor device. Furthermore, compared with a case where the groove 8 is provided around the entire perimeter of the mount 7, processing costs of the front surface circuit pattern 3*a* can be suppressed, and the costs for visual inspection can be suppressed. This can suppress an increase in manufacturing costs of the semiconductor device.

The groove 8 is hemispherical, so that the melted solder 5*a* is more likely to flow into the groove 8 to improve wettability of the solder 5*a* compared with a case described in Embodiment 1. The occurrence of voids in the solder 5*a* can thereby be suppressed.

Embodiment 3

Figure 5:
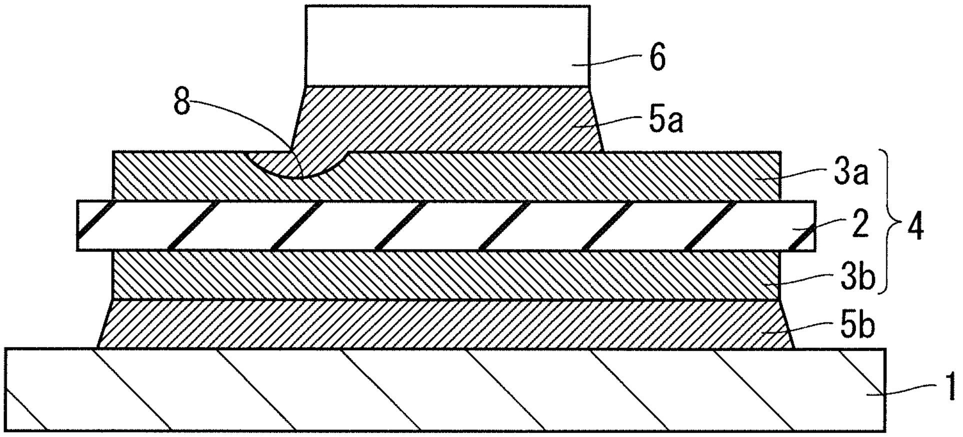
FIG. 5 is a partial cross-sectional view of a semiconductor device according to Embodiment 3.
Figure 6:
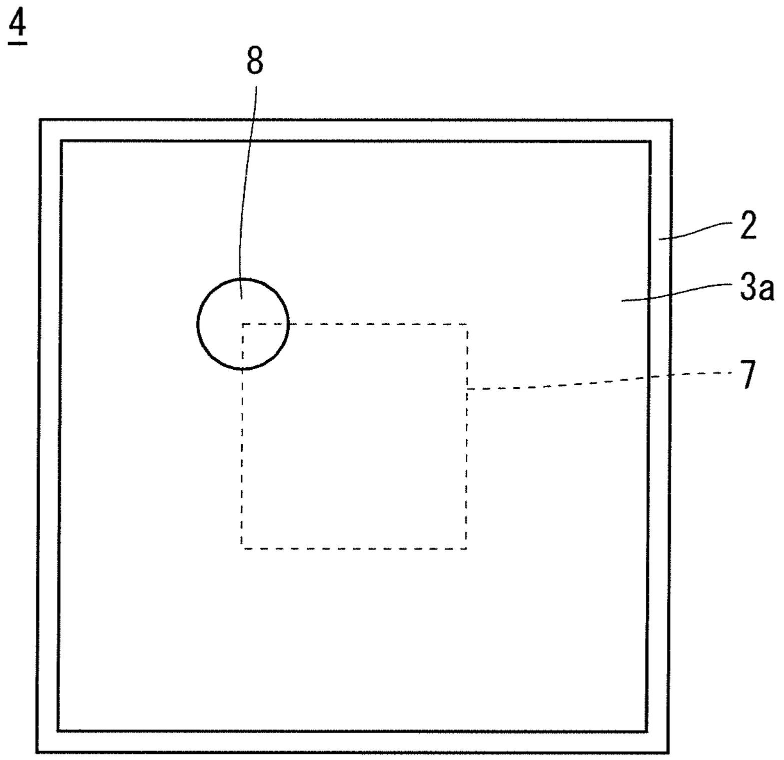
FIG. 6 is a top view of an insulating substrate of the semiconductor device according to Embodiment 3.

A semiconductor device according to Embodiment 3 will be described next. FIG. 5 is a partial cross-sectional view of the semiconductor device according to Embodiment 3. FIG. 6 is a top view of the insulating substrate 4 of the semiconductor device according to Embodiment 3. In Embodiment 3, the same components as those described in Embodiments 1 and 2 bear the same reference signs as those of the components described in Embodiments 1 and 2, and description thereof will be omitted.

As illustrated in FIGS. 5 and 6, the groove 8 is provided in a region including any of four corners of the mount 7 to be hemispherical in Embodiment 3. Specifically, the groove 8 is formed so that a vertex of any of the four corners of the mount 7 is located at the center of the groove 8.

The groove 8 has a depth smaller than the thickness of the front surface circuit pattern 3*a*, and preferably has a small depth of approximately 20 μm or more and 30 μm or less to avoid a local increase in thickness of the solder 5*a*. The groove 8 preferably has a diameter of 500 μm or more and 1 mm or less in view of the other members.

A location where the groove 8 is formed is not particularly limited as long as it is the region including any of the four corners of the mount 7, but, in a case where the location where the solder 5*a* squirts out is predictable according to conditions such as the combination of the insulating substrate 4 and the semiconductor element 6, the sizes of the insulating substrate 4 and the semiconductor element 6, and the temperature profile when the solder 5*a* is melted, the groove 8 is preferably formed in the region around the location.

While a method of forming the groove 8 is not particularly limited, the groove 8 may be formed by cutting or die pressing. The groove 8 may be formed by laser irradiation.

As described above, in the semiconductor device according to Embodiment 3, the groove 8 is provided in the region including any of the four corners of the mount 7 to be hemispherical. The solder 5*a* squirting out from below the semiconductor element 6 flows into the groove 8 to suppress adherence of the solder 5*a* to another member in the semiconductor device. Furthermore, compared with a case where the groove 8 is provided around the entire perimeter of the mount 7, the processing costs of the front surface circuit pattern 3*a* can be suppressed, and, as visual inspection is conducted only at the groove 8, the time of visual inspection can be reduced, and the costs for visual inspection can be suppressed. This can suppress an increase in manufacturing costs of the semiconductor device.

The groove 8 is provided in the region around the location where the portion of the melted solder 5*a* squirts out when curing. The solder 5*a* squirting out from below the semiconductor element 6 is thus likely to flow into the groove 8 to further improve the effect of suppressing adherence of the solder 5*a* to another member in the semiconductor device.

Thermal capacity at any of the four corners of the mount 7 increases, so that larger thermal stress is caused at any of the four corners of the mount 7, and thus the solder 5*a* squirting out from below the semiconductor element 6 is more likely to be guided to the groove 8 compared with a case where the groove 8 is linearly formed as in Embodiment 1.

The groove 8 is formed also outward of the mount 7, so that the occurrence of voids due to a gas generated when the semiconductor element 6 is mounted and a lack of wettability at the groove 8 can be mitigated compared with a case where the groove 8 is formed at the center of the mount 7 as in Embodiment 2.

Costs required to form the groove 8 can be reduced compared with a case where the groove 8 is formed at each of the four corners of the mount 7.

Embodiment 4

Figure 7:
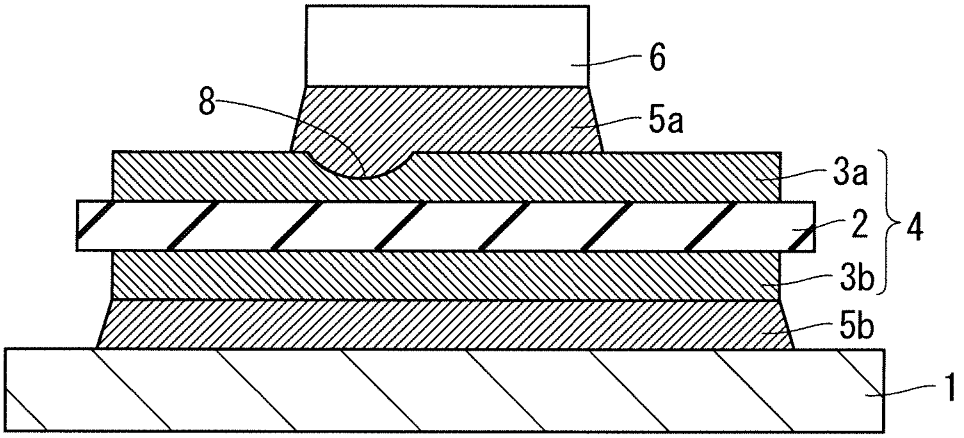
FIG. 7 is a partial cross-sectional view of a semiconductor device according to Embodiment 4.
Figure 8:
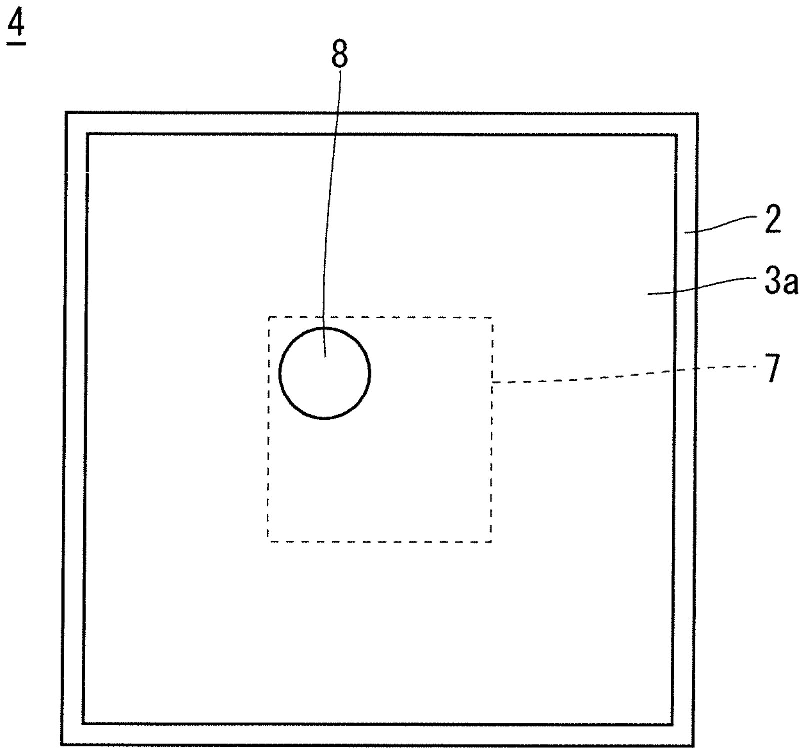
FIG. 8 is a top view of an insulating substrate of the semiconductor device according to Embodiment 4.

A semiconductor device according to Embodiment 4 will be described next. FIG. 7 is a partial cross-sectional view of the semiconductor device according to Embodiment 4. FIG. 8 is a top view of the insulating substrate 4 of the semiconductor device according to Embodiment 4. In Embodiment 4, the same components as those described in Embodiments 1 to 3 bear the same reference signs as those of the components described in Embodiments 1 to 3, and description thereof will be omitted.

As illustrated in FIGS. 7 and 8, the groove 8 is provided inward of any of the four corners of the mount 7 to be hemispherical in Embodiment 4. Specifically, the groove 8 is provided closer to any of the four corners of the mount 7 than to the center of the mount 7.

The groove 8 has a depth smaller than the thickness of the front surface circuit pattern 3*a*, and preferably has a small depth of approximately 20 μm or more and 30 μm or less to avoid a local increase in thickness of the solder 5*a*. The groove 8 preferably has a diameter of 4 mm or more and 6 mm or less, but may have a diameter less than or more than the range in view of the size of the semiconductor element 6 and the amount of solder 5*a*.

A location where the groove 8 is formed is not particularly limited as long as it is a location inward of any of the four corners of the mount 7, but, in a case where the location where the solder 5*a* squirts out is predictable according to conditions such as the combination of the insulating substrate 4 and the semiconductor element 6, the sizes of the insulating substrate 4 and the semiconductor element 6, and the temperature profile when the solder 5*a* is melted, the groove 8 is preferably formed in the region around the location.

As described above, in the semiconductor device according to Embodiment 4, the groove 8 is provided inward of any of the four corners of the mount 7 to be hemispherical. The solder 5*a* squirting out from below the semiconductor element 6 flows into the groove 8 to suppress adherence of the solder 5*a* to another member in the semiconductor device. Furthermore, compared with a case where the groove 8 is provided around the entire perimeter of the mount 7, processing costs of the front surface circuit pattern 3*a* can be suppressed, and the costs for visual inspection can be suppressed. This can suppress an increase in manufacturing costs of the semiconductor device.

The groove 8 is provided in the region around the location where the portion of the melted solder 5*a* squirts out when curing. The solder 5*a* squirting out from below the semiconductor element 6 is thus likely to flow into the groove 8 to further improve the effect of suppressing adherence of the solder 5*a* to another member in the semiconductor device.

The groove 8 is formed at a location closer to a location immediately below the semiconductor element 6 to provide better control of thermal expansion and contraction compared with that in Embodiment 3. Furthermore, the groove 8 does not protrude from the exterior of the mount 7, so that a region other than the mount 7 and the groove 8 of the front surface circuit pattern 3*a* can be reduced. This allows for reduction in size of the semiconductor device.

Thermal capacity at any of the four corners of the mount 7 increases, so that larger thermal stress is caused at any of the four corners of the mount 7, and thus the solder 5*a* squirting out from below the semiconductor element 6 is more likely to be guided to the groove 8 compared with a case where the groove 8 is linearly formed as in Embodiment 1.

Costs required to form the groove 8 can be reduced compared with a case where the groove 8 is formed at each of the four corners of the mount 7.

Embodiments can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising:

preparing an insulating substrate including an insulating layer and a circuit pattern disposed on a surface of the insulating layer; and bonding a semiconductor element to a mount of a surface of the circuit pattern via solder, wherein at least a portion of a groove is provided in a surface of the mount such that at least the portion of the groove is directly below the semiconductor element, the solder, which bonds the semiconductor element to the mount, includes an outermost perimeter, upon bonding the semiconductor element to the mount of the surface of the circuit pattern, the outermost perimeter of the solder includes a first portion where the solder contacts the surface of the mount and a second portion where the solder is in the groove, the surface of the mount being above the groove, the portion of the outermost perimeter of the solder contacting the surface of the mount is continuous around a majority of the outermost perimeter of the solder, and in plan view, the groove is entirely spaced from one of a plurality of sides of the semiconductor element.

2. The method according to claim 1, the method comprising:

disposing the solder on the mount;

disposing the semiconductor element on the solder;

heating the solder and thereby melting the solder; and after disposing the solder, disposing the semiconductor element, and heating the solder, curing the solder by cooling the melted solder to thereby bond the semiconductor element to the mount, wherein the groove is provided in a region around a location from where a portion of the melted solder that is not yet cured squirts out during the curing.

3. The method according to claim 2, wherein upon melting the solder, the solder squirts into the groove.

4. The method according to claim 1, wherein the groove is provided in a region including any of four corners of the mount and is hemispherical.

5. The method according to claim 1, wherein the groove is the only groove in the mount.

6. The method according to claim 1, wherein the groove is positioned asymmetrically with respect to the semiconductor element when viewed in plan view after bonding the semiconductor element to the mount.

7. A method of manufacturing a semiconductor device comprising:

preparing an insulating substrate including an insulating layer and a circuit pattern disposed on a surface of the insulating layer; and bonding a semiconductor element to a mount of a surface of the circuit pattern via solder, wherein at least a portion of a groove is provided in a surface of the mount such that at least the portion of the groove is directly below the semiconductor element, the solder, which bonds the semiconductor element to the mount, includes a perimeter, upon bonding the semiconductor element to the mount of the surface of the circuit pattern, the perimeter of the solder includes at least a portion where the solder contacts the surface of the mount, the surface of the mount being above the groove, the groove is the only groove in the mount, the groove is positioned asymmetrically with respect to the semiconductor element when viewed in plan view after bonding the semiconductor element to the mount, and in plan view, the groove is entirely spaced from one of a plurality of sides of the semiconductor element.

8. The method according to claim 7, wherein the perimeter of the solder is an outermost perimeter of the solder, and the outermost perimeter of the solder includes the portion where the solder contacts the surface of the mount and further includes another portion where the solder is in the groove.

* * * * *